(12) United States Patent
Johansson

(10) Patent No.: US 9,442,833 B1
(45) Date of Patent: Sep. 13, 2016

(54) MANAGING DEVICE IDENTITY

(75) Inventor: Karl-Anders R. Johansson, Malmo (SE)

(73) Assignee: QUALCOMM Incorporated, San Diego, CA (US)

( * ) Notice: Subject to any disclaimer, the term of this patent is extended or adjusted under 35 U.S.C. 154(b) by 18 days.

(21) Appl. No.: 13/187,319

(22) Filed: Jul. 20, 2011

Related U.S. Application Data

(60) Provisional application No. 61/365,858, filed on Jul. 20, 2010.

(51) Int. Cl.
*G06F 12/00* (2006.01)
*G01R 31/28* (2006.01)

(52) U.S. Cl.
CPC .................... *G06F 12/00* (2013.01)

(58) Field of Classification Search
CPC ....................................... G06F 12/00
USPC ........................................ 711/103
See application file for complete search history.

(56) References Cited

U.S. PATENT DOCUMENTS

| | | | | |
|---|---|---|---|---|
| 5,058,112 A * | 10/1991 | Namitz et al. | ................ | 714/703 |
| 5,872,797 A * | 2/1999 | Theodoseau | ................... | 714/738 |
| 6,006,016 A * | 12/1999 | Faigon et al. | .................. | 714/48 |
| 6,965,673 B1 * | 11/2005 | Boneh et al. | .................... | 380/28 |
| 7,328,384 B1 * | 2/2008 | Kulkarni et al. | ............. | 714/725 |
| 8,756,666 B1 * | 6/2014 | Silva et al. | ........................ | 726/6 |
| 2002/0184557 A1 * | 12/2002 | Hughes et al. | ................... | 714/8 |
| 2004/0254762 A1 * | 12/2004 | Hopkins et al. | .............. | 702/182 |
| 2007/0141731 A1 * | 6/2007 | Hemink et al. | ................. | 438/14 |
| 2007/0204192 A1 * | 8/2007 | Yeh et al. | ...................... | 714/726 |
| 2009/0183128 A1 * | 7/2009 | Rajski et al. | ..................... | 716/4 |
| 2009/0271675 A1 * | 10/2009 | Dickson et al. | .............. | 714/732 |
| 2010/0095149 A1 * | 4/2010 | Lee et al. | ........................... | 714/6 |
| 2010/0164013 A1 * | 7/2010 | Jaffe et al. | ..................... | 257/390 |
| 2010/0262764 A1 * | 10/2010 | Liu et al. | ....................... | 711/103 |
| 2010/0293422 A1 * | 11/2010 | Huang et al. | ................. | 714/726 |
| 2011/0283135 A1 * | 11/2011 | Burger et al. | .................. | 714/6.1 |
| 2011/0285839 A1 * | 11/2011 | Kotaki et al. | .................... | 348/80 |

OTHER PUBLICATIONS

Jakobsson et al., "Retroactive Detection of Malware with Applications to Mobile Platforms", Aug. 11, 2010.
Jakobsson et al., "Practical and Secure Software-Based Attestation", Mar. 14, 2011.

* cited by examiner

*Primary Examiner* — Yaima Rigol
*Assistant Examiner* — Gautam Sain
(74) *Attorney, Agent, or Firm* — Loza & Loza, LLP

(57) ABSTRACT

Enrolling a device identity is disclosed. A determination is made as to whether one or more areas of a storage device has a sufficient number of faults. If an insufficient number of faults is present, additional faults are generated. Verifying a device identity is also disclosed. A fingerprint based on the presence of one or more permanent faults in a storage device is received. The received fingerprint is compared with one or more stored fingerprints to determine an identity of the device.

29 Claims, 12 Drawing Sheets

MANAGING DEVICE IDENTITY

CROSS REFERENCE TO OTHER APPLICATIONS

This application claims priority to U.S. Provisional Patent Application No. 61/365,858 entitled MANAGING DEVICE IDENTITY filed Jul. 20, 2010 which is incorporated herein by reference for all purposes.

BACKGROUND OF THE INVENTION

Individuals routinely use electronic devices to conduct transactions, such as to purchase items, transfer money, or access premium content. Typically, in order to engage in such transactions, an individual must first register for an account and supply or be issued a credential, such as a password. The user credential serves as an access or other control to help ensure that only an authorized user is permitted to engage in the transaction. Unfortunately, passwords can be guessed or otherwise compromised by nefarious individuals seeking to impersonate a legitimate user. In some cases, rudimentary device identifiers are used, either in conjunction with or instead of user credentials, to improve assurances that a legitimate user (via an appropriate device) is attempting to engage in a transaction. A correct user credential supplied via a device that is likely to be under the control of the legitimate user offers additional assurance that the transaction is being attempted by the legitimate user. One example of a device identifier is a cookie. Unfortunately, cookies can be stolen by techniques such as cross-site scripting attacks and farming attacks and then used to impersonate the device of a legitimate user. Another example of a device identifier indicative of a legitimate user's access is an IP address (e.g., in the same range as the victim's home or work computer). Unfortunately, IP addresses can be spoofed or appropriated through bots. Improvements in device identification techniques would therefore be desirable.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Various types of storage, such as flash memory and magnetic hard disk drives, are susceptible to errors (e.g., having bad cells, blocks, and/or sectors). Defects can occur naturally, either during manufacture or through normal subsequent use. Defects can also be intentionally induced, such as through the intentional repeated writing and erasing of a portion of a flash memory. As will be described in more detail below, these defects (including their locations and types) can be used to identify a device.

Figure 1:
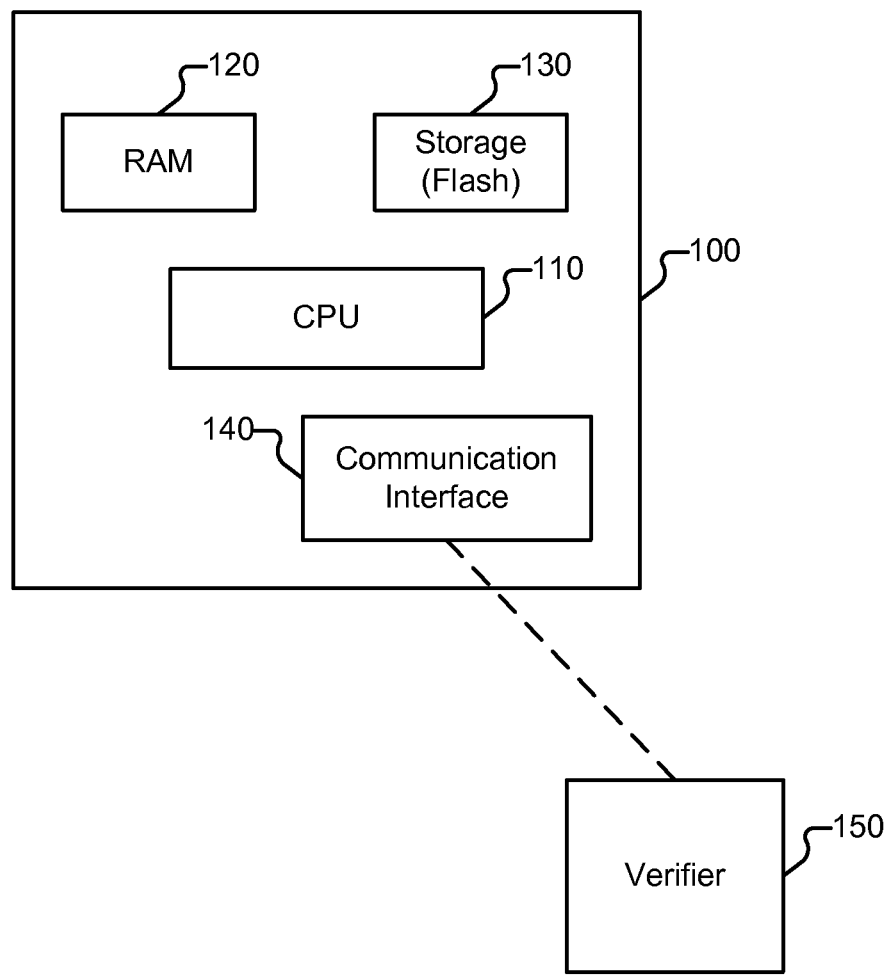
FIG. 1 illustrates an embodiment of a device.

FIG. 1 illustrates an embodiment of a device. Included in device 100 is a central processing unit 110, a random access memory 120, storage 130, and a communication interface 140. In the example shown, device 100 is a mobile telephony device. Other examples of devices that can be used in conjunction with the techniques described herein include desktop, laptop, and notebook computers; tablet devices; gaming consoles; and settop boxes. Also in the example shown, storage 130 is a removable NAND flash card. A variety of types of storage can be used in conjunction with the techniques described herein. Further, device 100 can include multiple storages 130 (e.g., soldered flash and a removable flash drive) and those multiple storages can be of different types (e.g., one storage being flash and another being a magnetic disk). Communication interface 140 is used to communicate with an external verifier 150.

Regardless of type (i.e., NOR type vs. NAND type; SLC type vs. MLC type), all flash memories have as a property that data can only be erased in blocks that are large in relation to the minimum readable chunk. As used herein, a "block" is the smallest collection of bits that can be erased, a "page" is the smallest collection of bits that can be programmed, and a "cell" is the physical storage space for one (SLC) or more (MLC) bits. The above terminology is more oriented toward NAND flash than NOR, but the techniques described herein can be adapted with respect to NOR flash, and to other types of storage as well.

Flash memories, irrespective of type, operate by storing charge in a cell that includes an insulated floating-gate transistor. NAND flash is programmed using quantum tunnel injection and erased using quantum tunnel release. NOR flash uses hot-electron injection for programming and quantum tunneling for erasing. All types of flash memories can suffer from wear when an excessive amount of erasing and programming cycles is performed. Such wear can result in errors on the bit level, page level, or block level, as applicable. The errors can be permanent or temporary. Errors are also referred to herein as "faults."

Programming errors, or "program disturb" errors, can occur at neighboring cells to the cell being programmed. Program disturb errors are not permanent and are removed at the next block erase. Program disturb errors are typically compensated for by error correcting codes. "Read disturb" errors are caused by a voltage differential between neighboring pages that sets neighboring page cells in a slightly programmed mode when reading another page. Read disturb errors are also not permanent and are erased with a block erase. Another type of non-permanent error is a "data retention" error in which the cell gains or loses charge over time. The problem is more evident in a cell that has been erased often.

An example of a permanent error is the "endurance" error caused by excessive program/erase (P/E) cycles in which charge is trapped in the dielectric, causing a permanent shift in cell characteristics. The flash chip can notify the CPU or memory controller that an endurance error occurred during program or erase. Endurance errors can be added, but do not disappear. When using flash memories, it is common to use a so-called Bad Blocks List (BBL) to indicate which blocks should no longer be used. This may be a part of a Flash Translation Layer (FTL) that masks the necessary moving around of blocks from an actual file system implemented on top of it.

Figure 2:
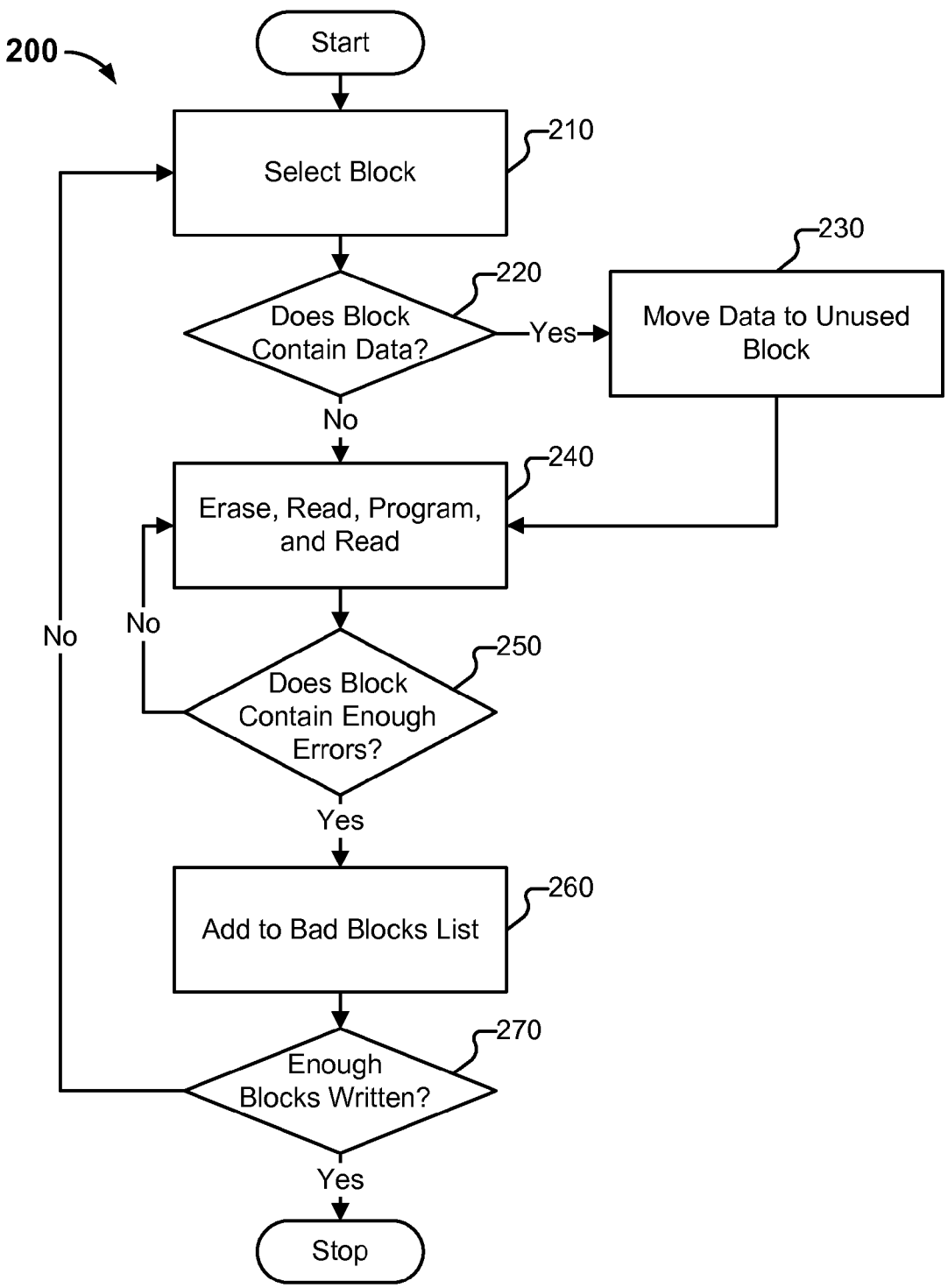
FIG. 2 illustrates an example of a process for creating a device identity.

FIG. 2 illustrates an example of a process for creating a device identity. The process shown in FIG. 2 can be initially performed at a variety of times. As one example, the process can be initiated by a manufacturer of storage 130. As another example, the process can be initiated by a manufacturer of device 100. As yet another example, the process can be initiated in response to an end user's first use of a device or in response to an end user taking a particular action, such as loading a banking application on device 100. In the latter case, the user may be prompted to install software with sufficiently low level access to the storage. Enrollment may be mandatory to access certain services (e.g., watch a movie) or optional (e.g., with the user being incentivized to enroll the device).

The process begins at 210 when a block is selected for processing. Various techniques can be used to select a block. As one example, if process 200 is performed by the manufacturer of storage 130, the first time the process is run, block 1024 may always be selected at 210 for all storage manufactured by that entity. As another example, verifier 150 (or another appropriate entity) can determine that blocks 1122-1125 should be used for all devices, for all devices of a particular type (e.g., particular brands of cellular phones), or for devices with other characteristics (e.g., those enrolling in the month of January). Blocks can also be selected at random or based on other appropriate rules at 210. If the block selected at 210 contains data (e.g., is in use by a file system) (220), the data is moved elsewhere (230) and the file system is notified. In some cases, the FTL is used to free up any data in the selected block in a manner that is transparent to the file system. Once the block is determined to be empty (i.e., no file system data uses or will use the block), the block is repeatedly subjected to a series of erase and program operations (240) until a sufficient number M bit errors appear in the block (250). The block is then added to a Bad Blocks List (260) to ensure that it is not subsequently allocated by the file system. In some embodiments, portions 210-260 of process 200 are repeated until a sufficient number N blocks have been processed.

The values of M and N are design choices. With a sufficiently large value of N and a suitable value of M, a device can be uniquely identified with a high certainty. Different values M can be used for different iterations of the N blocks. In some embodiments, the N blocks are in a preset contiguous range. For example, they may always be blocks 1024-1027 for all storage. As another example, different batches of different storage may have different preset ranges (e.g., with a first batch using blocks 1024-1027 and a later batch using 2048-2051). The blocks can also be spread out in a manner that is not possible to anticipate. In various embodiments, some portion of the N blocks is required to be in a preset range, and others are not.

The process shown in FIG. 2 can also be repeated—e.g., being initially performed by a manufacturer, and then subsequently performed with respect to the user's enrollment of the device with two different service providers (e.g., a bank and an online auction site). In some embodiments, the bank and the online auction site each have their own associated verifiers. In other embodiments, verification services are provided by a single entity with whom both the bank and the online auction site have a business arrangement for those services. Further, the bank and the online auction site can each specify their own policies as to how matching should be performed. For example, the bank may require a verbatim match, while the online auction site may allow deviations of up to three additional errors and two missing errors.

Figure 3:
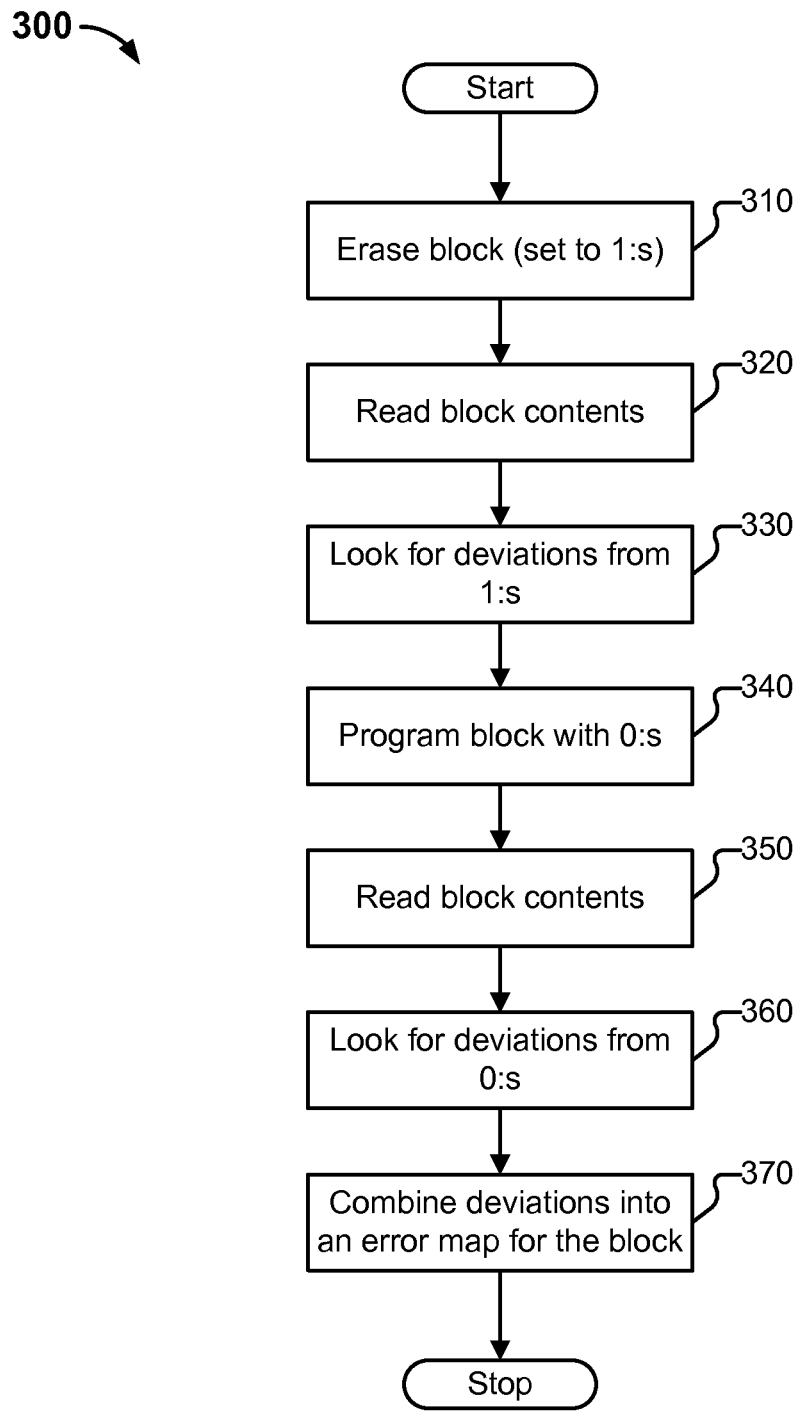
FIG. 3 illustrates an example of a process for causing an error.

FIG. 3 illustrates an example of a process for causing an error. In some embodiments, the process shown in FIG. 3 is performed at block 240 of the process shown in FIG. 2. Process 300 begins at 310 when the block is erased—by attempting to set all bits to 1:s. At 320, the block contents are read to RAM 120 and checked to see which bits, if any, deviate from 1:s (330). Next, an attempt is made to program all bits in the block to 0:s (340). At 350, the block contents are read to RAM 120 and checked to see which bits, if any, deviate from 0:s (360). Any bits that are found to deviate at 330 or at 360 are errors. A given error has a location (i.e. the particular cell where the error occurs) and a type (i.e., stuck to zero or stuck to one). At 370, any errors detected at 330 or 360 are combined into an error map for the block (also referred to herein as a block error map). Other write patterns can also be used, instead of the all zero and all one writes illustrated in FIG. 3.

Figure 4:
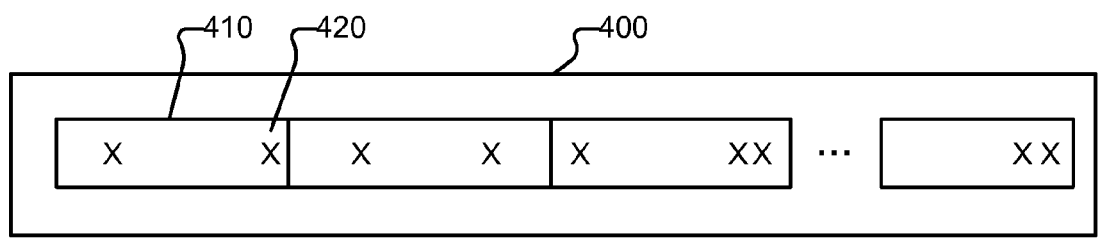
FIG. 4 illustrates an example of an error map.

FIG. 4 illustrates an example of an error map. Error map 400, also referred to as total error map 400 and a fingerprint 400, is the concatenation of all N block error maps (410), such as are created in some embodiments at portion 370 of the process shown in FIG. 3. Each block error map includes at least M errors (420). As previously mentioned, with a sufficiently large value of N and a suitable value of M, fingerprint 400 will be unique between any two devices with a high certainty. The locations of bit errors in flash depend largely on random perturbations in the silicon rather than the program/erase pattern. For example, for NAND flash it is not possible to control what individual cells in a block are turned bad by reading it. This means that it is not possible to imprint a particular identity in such a device (i.e., to clone the specific defects found in one flash drive onto another flash drive).

Figure 5:
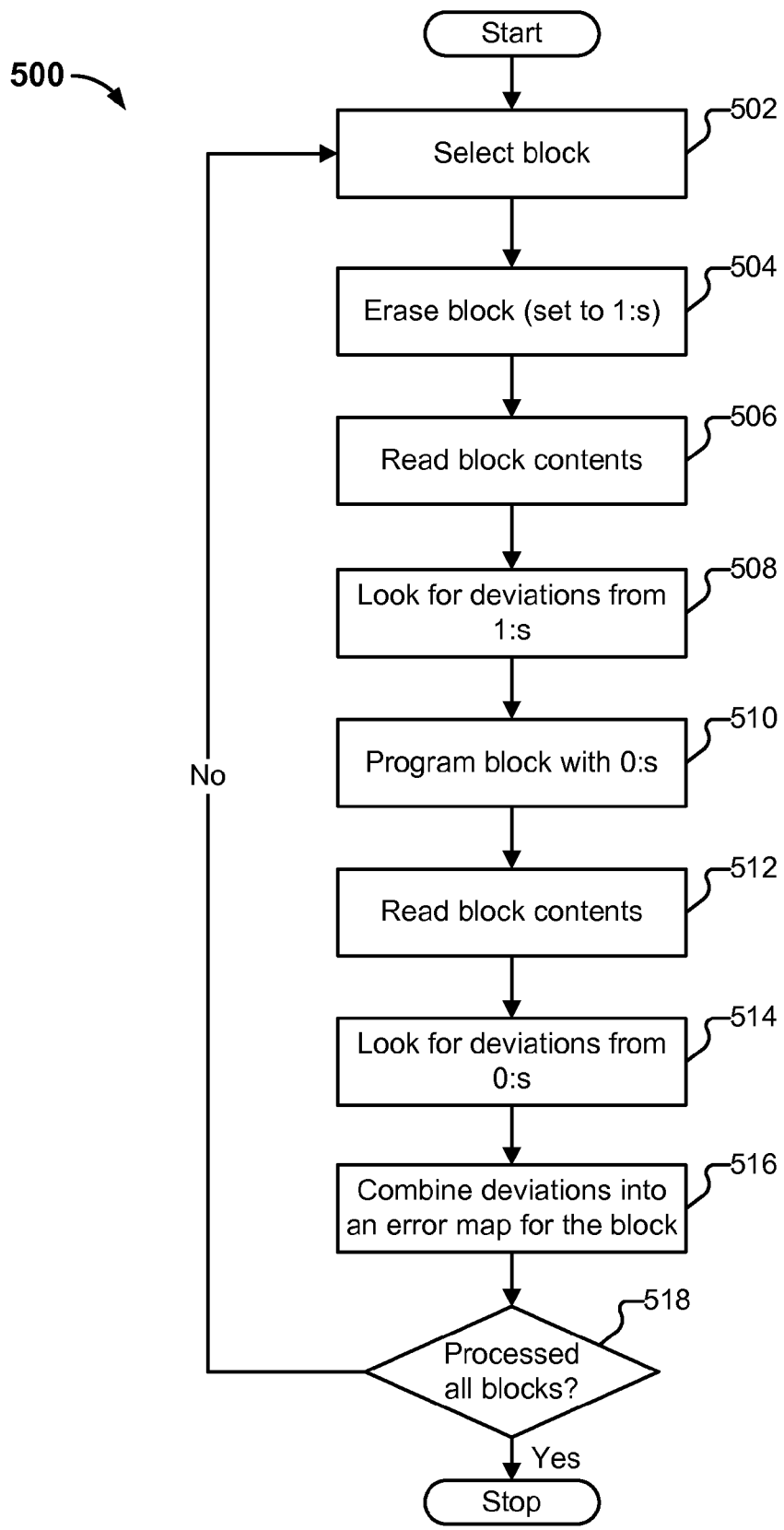
FIG. 5 illustrates an example of a process for determining a device identity.

FIG. 5 illustrates an example of a process for determining a device identity. In some embodiments, process 500 is performed in response to a request by the user to access a resource. As one example, process 500 can be initiated when a user of device 100 loads a banking application. As another example, process 500 can be initiated when the user attempts to access a video or other content subject to digital rights management. Process 500 can also be initiated externally, such as by verifier 150, by a carrier, or other entity with an interest in determining an identity of device 100.

The process begins at 502 when a block is selected. A variety of techniques can be used to select the block at 502. Although process 500 is similar to process 300, the technique employed to select a block at 502 need not be the same as that employed at 210, so long as those blocks that contain the errors used to make fingerprint 400 are ultimately evaluated as part of both processes. For example, in some embodiments four blocks are ultimately selected at 210 of process 200, while all blocks are sequentially inspected in process 500 (i.e., block 1 is initially selected at 502). Which blocks are to be selected can be stored remotely, e.g., in a database of verifier 150, and can also be stored locally on the device, as applicable. At 504, the selected block is erased—by attempting to set all bits to 1:s. At 506, the block contents are read back to RAM and checked to see which bits, if any, deviate from 1:s (508). Next, an attempt is made to program all bits in the block to 0:s (510). At 512, the block contents are read back to RAM and checked to see which bits, if any, deviate from 0:s (514). Any bits that are found to deviate at 508 or 514 are errors and are combined into a block error map (516). Portions 502-516 are repeated for any remaining blocks (518) (e.g., those needed to construct the fingerprint). The block error maps are then concatenated to form a fingerprint.

Figure 6:
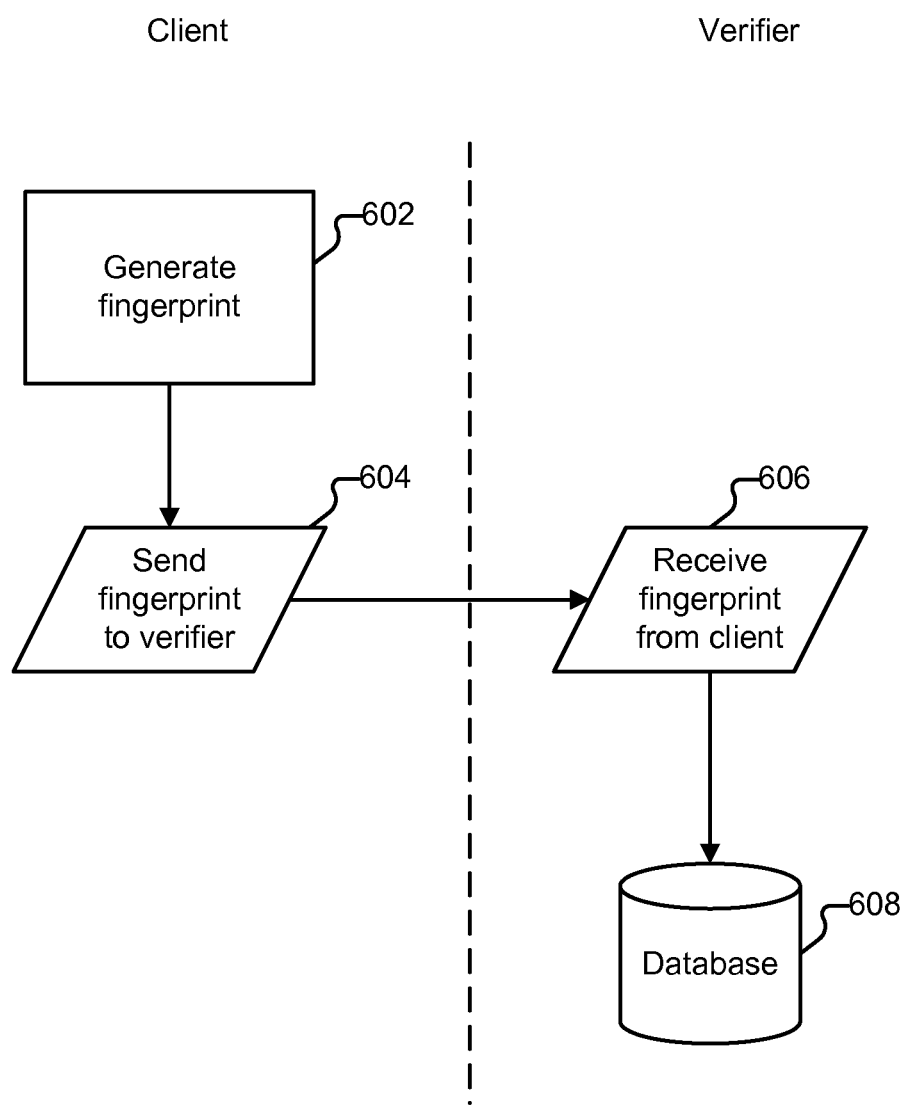
FIG. 6 illustrates the communication of a fingerprint from a device to a verifier during enrollment.

FIG. 6 illustrates the communication of a fingerprint from a device to a verifier during enrollment. As shown, client 100 generates a fingerprint, such as fingerprint 400 (602). The fingerprint is transmitted to verifier 150 by communication interface 140 (604). When the verifier receives the fingerprint (606), it stores the fingerprint in a database for future use (608). In some embodiments, verifier 150 also stores additional information associated with the fingerprint in database 608, such as a username, account number, or other identifier/mapping between the device fingerprint and a user. In various embodiments (such as where a fingerprint is generated by a manufacturer of storage 130 or device 100), the fingerprint is communicated to verifier 150 by the manufacturer.

Figure 7:
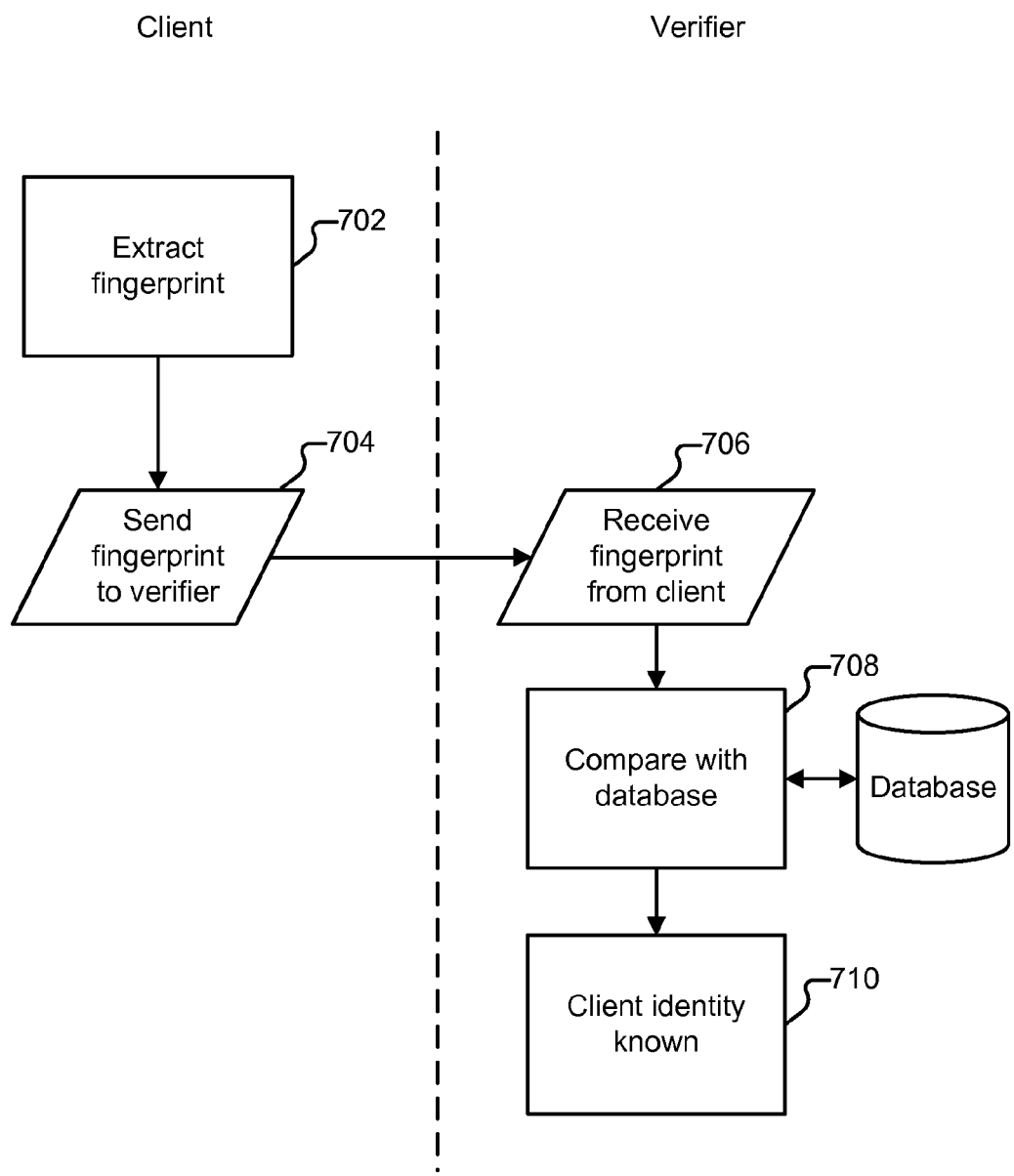
FIG. 7 illustrates the communication of a fingerprint from a device to a verifier for verification.

FIG. 7 illustrates the communication of a fingerprint from a device to a verifier for verification. As shown, device 100 generates a fingerprint, such as through the process shown in FIG. 5 (702). The fingerprint is transmitted to verifier 150 by communication interface 140 (704). When the verifier receives the fingerprint (706), it compares the fingerprint with those stored in its database (708) and locates a match (710). Verifier 150 can provide a variety of outputs, including "no match" if the fingerprint does not match any data stored in its database, a username (or other identifier) associated with the matched fingerprint, a probability that the provided fingerprint matches one stored in the database, and/or the number of other devices in the database having substantially similar fingerprints.

Figure 8:
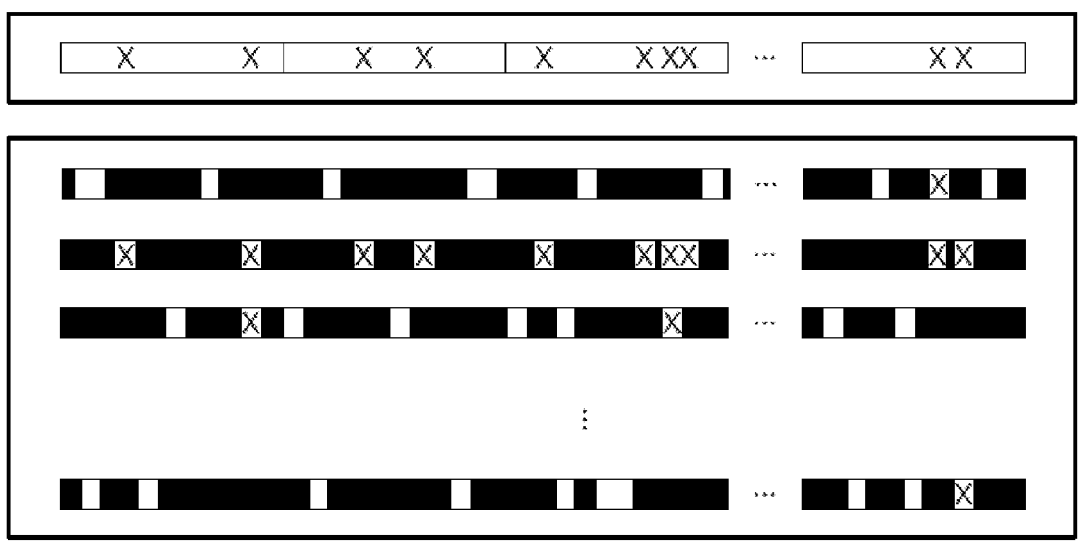
FIG. 8 illustrates an example technique for matching a fingerprint.

FIG. 8 illustrates an example technique for matching a fingerprint. In some embodiments, the technique illustrated in FIG. 8 is used in conjunction with portions 708 and 710 of the process shown in FIG. 7. As shown in FIG. 8, the inverted fingerprints for all devices stored in the verifier's database can be used as filters for the fingerprint received at 706. In some cases, the act of performing process 500 will generate new errors. New errors can also be acquired through physical abuse or other damage to the device, and potentially by reading cells nearby those used to generate the fingerprint. The addition of any such new errors will likely be gradual and can be detected. Further, such new errors are likely to be program disturbs and read disturbs, but data retention errors and endurance errors are possible. By using the approach illustrated in FIG. 8, more error bits can be added to the fingerprint while still allowing for the correct identification of the device. In some embodiments, a small amount of error bits are allowed to drop from the fingerprint as well. One reason for this is to accommodate temporary errors that might be encountered while extracting the fingerprint (702). The value of N (number of blocks) can be increased to maintain a good confidence level of the identification, as needed. In some embodiments, received fingerprints that are determined to match, but deviate slightly from what is already present in the database are added to the database (either in addition to the already stored fingerprint or overwriting what is stored). This allows for the gradual evolution of the fingerprint.

In addition to creating an identity by creating bad cells (e.g., as illustrated at 240 in the process shown in FIG. 2), it is also possible to use a pre-existing error condition. For example, due to impurities in silicon and irregularities in the manufacturing process, memory units may naturally have a large number of bad cells immediately after manufacture. In some embodiments, rather than (or in addition to) creating errors, an identity is established based on the existing error conditions. Two approaches are discussed in conjunction with FIGS. 9 and 10.

Figure 9:
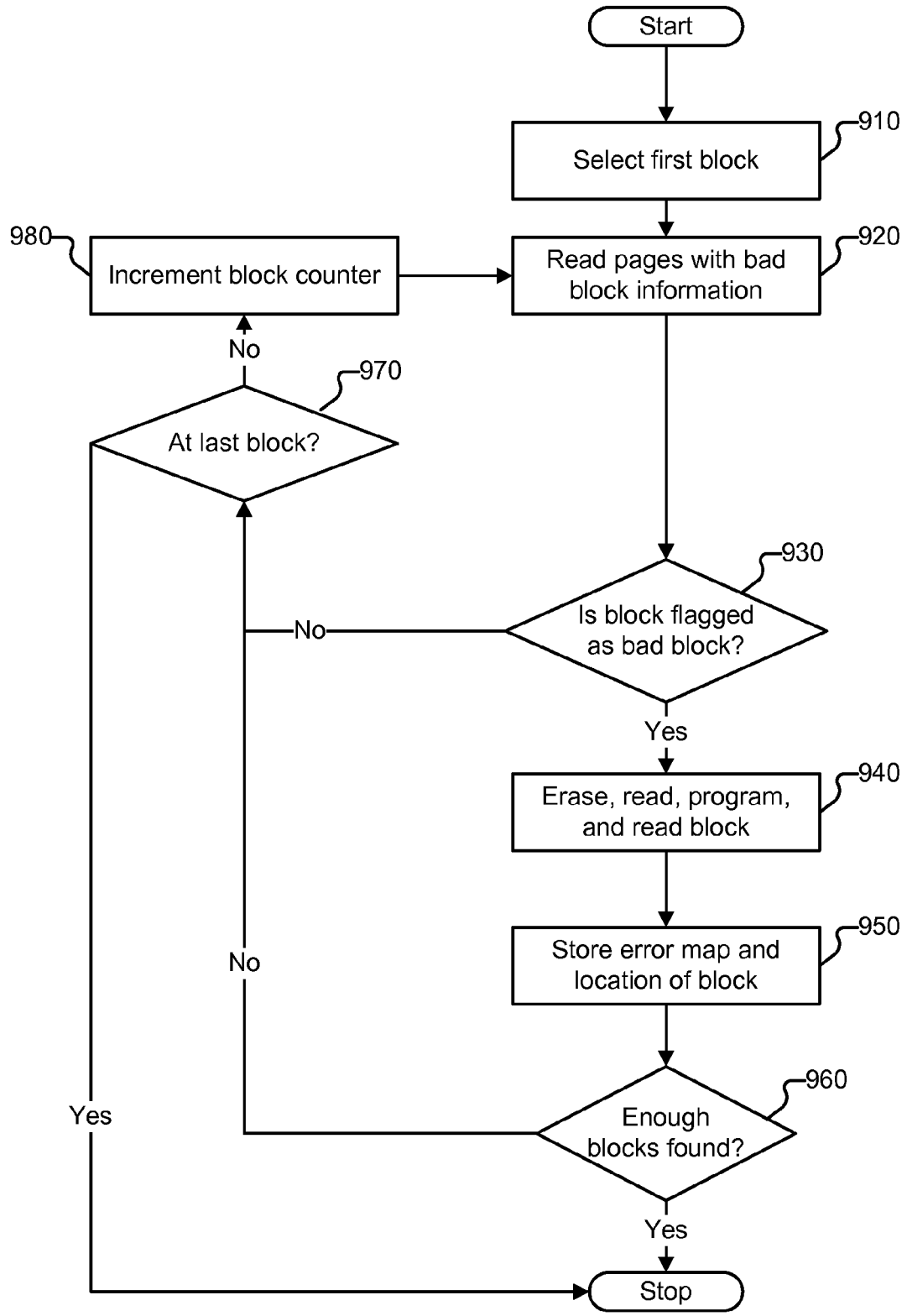
FIG. 9 illustrates an example of a process for creating a device identity using the loci of bad cells in bad blocks already present in the flash memory from manufacture.

FIG. 9 illustrates an example of a process for creating a device identity using the loci of bad cells in bad blocks already present in the flash memory from manufacture. The entire flash memory will be traversed beginning with the first block (910). The first one or two pages in the block are read (920) depending on flash memory type. Bad block information about the whole block is stored in the spare area of this page/these pages. The Bad block information is checked to see whether the block is considered bad from the factory (930). If it is not, the block is skipped. If the block is considered bad, the block is erased (e.g., set to 1:s), read, programmed to 0:s, and read again to ascertain exactly which bits were erroneous (940). In some embodiments, the bad block information is restored while programming the blocks so as to not prevent anyone relying on this method for determining badness of blocks. The resulting error map extracted from erasing and programming is stored in RAM 120 along with the address of the bad block (950). If enough blocks (N) have been found (960), the process ends. If more are needed and there are more blocks available (970), the block counter is advanced (980) and the relevant information from the next block is fetched (920). If there are no more blocks available, in some embodiments the process is aborted and a shorter fingerprint is generated. In other embodiments, additional errors are generated as needed (i.e., combining the process shown in FIG. 9 with that shown in FIG. 2).

Figure 10:
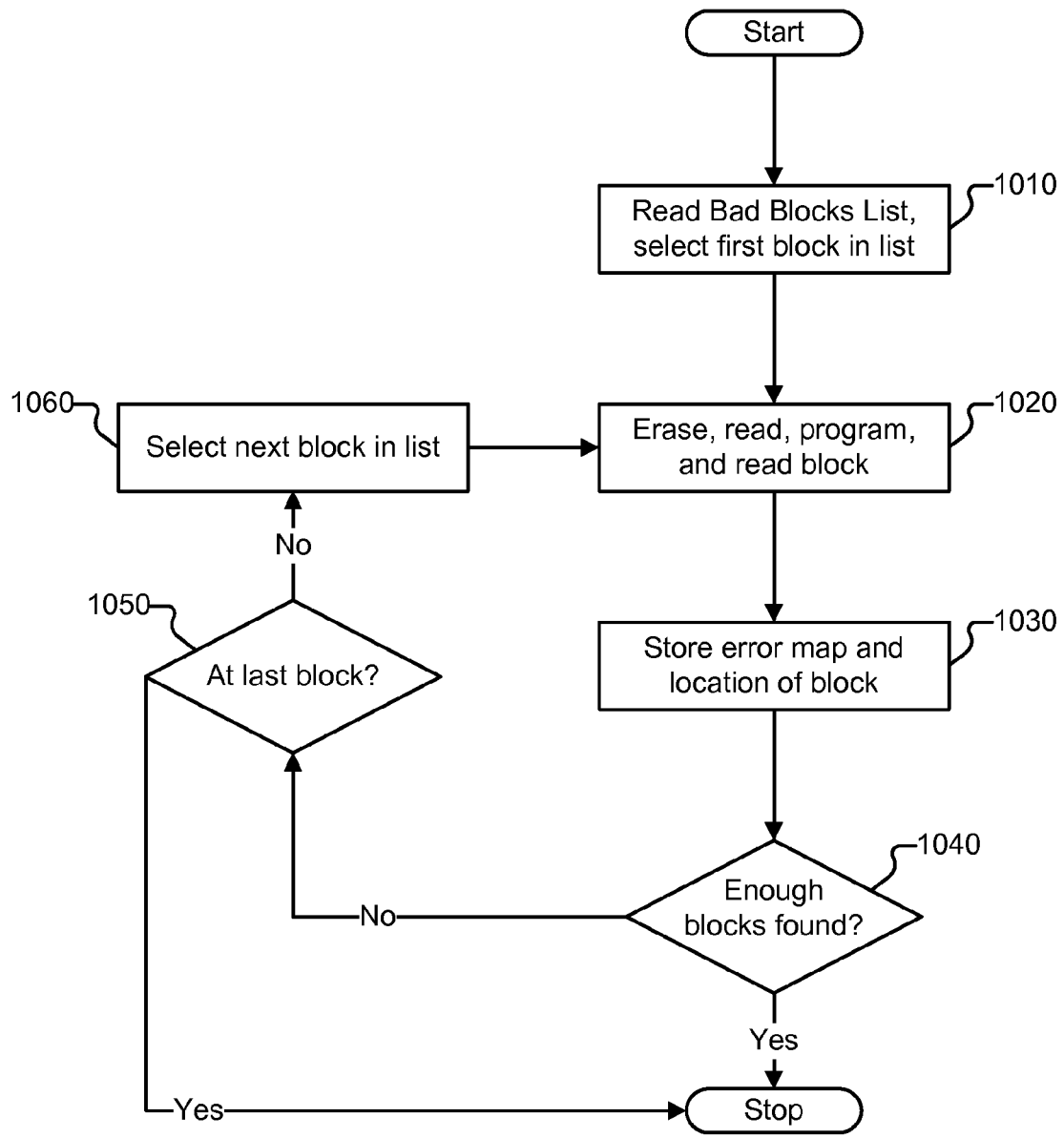
FIG. 10 illustrates an example of a process for creating a device identity using an already available Bad Blocks List.

FIG. 10 illustrates an example of a process for creating a device identity using an already available Bad Blocks List. The process begins at 1010 by reading the Bad Blocks List and selecting its first entry as the first block to process. The error map is extracted directly by erasing, reading, programming and reading the entire block while preserving bad block information at relevant places (1020). The error map and location of the block is stored (1030). If enough blocks have been found (1040) the process ends. If not, and there are more blocks to process (1050), the next block in the bad blocks list (1060) is advanced to for processing. As with the process shown in FIG. 9, if there are no more blocks available, in some embodiments the process is aborted and a shorter fingerprint is generated. In other embodiments, additional errors are generated as needed (i.e., combining the process shown in FIG. 10 with that shown in FIG. 2).

If needed (i.e., because too many new errors have been added), a new identity can be established using another portion of the storage. In such a case, verifier 150 may pick a new location to use for the fingerprinting and store an indicator of which blocks are to be used when extracting the fingerprint. In some embodiments, those blocks physically adjacent to the blocks used in the fingerprinting are added to the Bad Blocks List to help minimize the likelihood that reading those adjacent blocks will degrade the blocks used in the fingerprinting.

If desired, users can opt out from having a readable identity on a given device—whether this has already been imprinted (e.g., by the manufacturer) or not—by causing essentially all of the cells in a block or other storage area to be set (by making them all bad).

Additional Sources of Defects

Hard Drives

Figure 11:
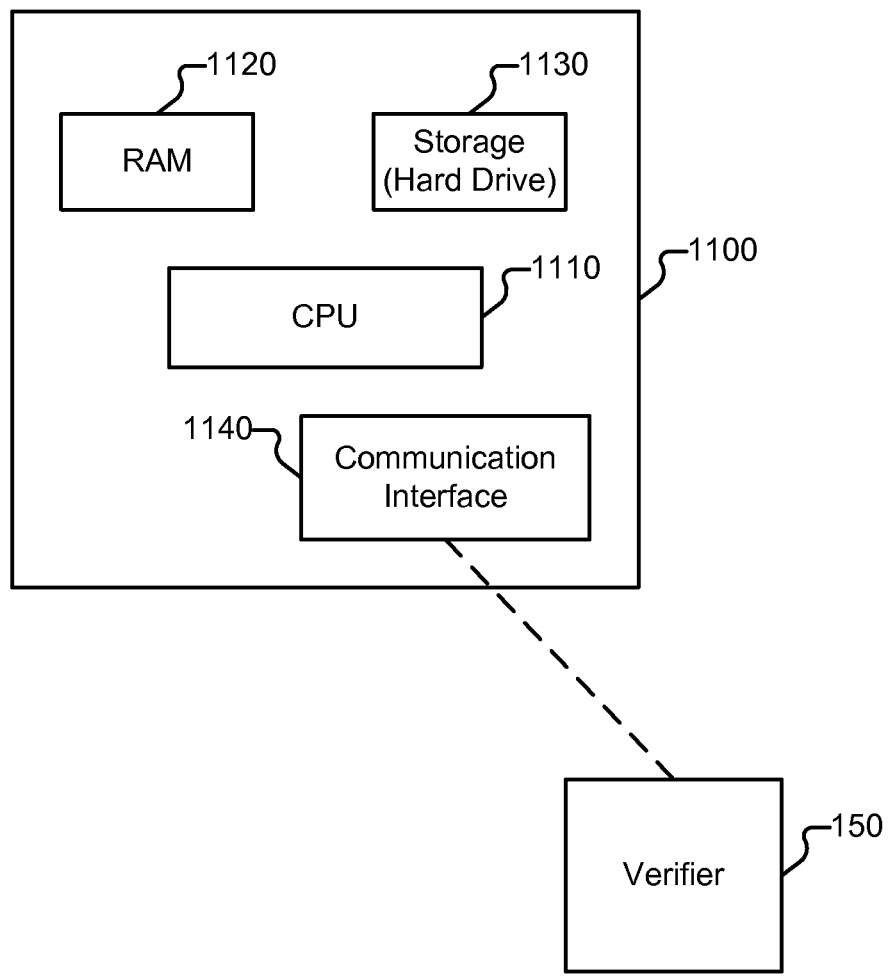
FIG. 11 illustrates an embodiment of a device.

As explained above, other types of storage can also have errors and be used in conjunction with the techniques described herein. For example, it is possible to use traditional magnetic hard drives, as included in the device illustrated in FIG. 11. Specifically, FIG. 11 illustrates a laptop computer. Computer 1100 includes a CPU 1110, RAM 1120, hard drive 1130, and communication interface 1140. Defects in hard drive 1130 can be used to generate a fingerprint for identifying computer 1100. The smallest accessible portion of a hard drive is a sector. Analogous to the Bad Blocks List, hard drives have Bad Sector Lists. The Bad Sector List is typically stored in flash memory within the hard drive.

Figure 12:
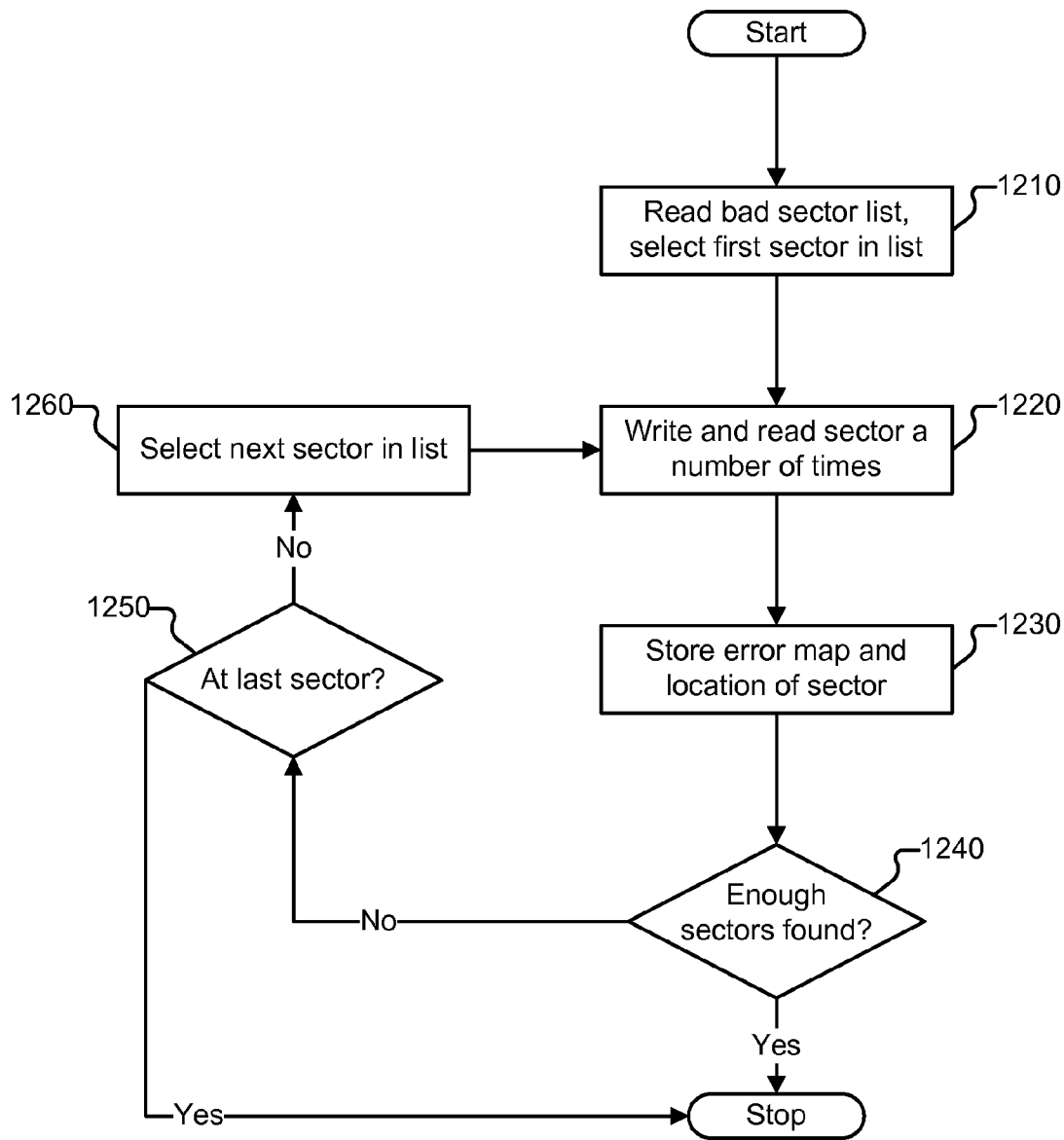
FIG. 12 illustrates an example of a process for generating a fingerprint using a hard drive.

FIG. 12 illustrates an example of a process for generating a fingerprint using a hard drive. The process begins at 1210 when the Bad Sector List is first read and a first sector is selected. The selected sector is repeatedly written to and read from to determine the nature of the error within the sector (1220). The loci of errors are stored in an error map for the sector and the error map as well as sector location is stored (1230). If enough sectors to construct a fingerprint have been found (1240), the process ends. If more sectors are needed (1250) and there are more sectors available, a new sector index is selected from the bad sector list (1260) and the next sector is evaluated (1220), repeating until all or enough sectors have been processed.

RAM

In addition to secondary storage, such as flash drives and hard drives, other hardware defects can also be used and the techniques described herein adapted accordingly. For example, impurities in RAM can also be used. As with the manufacture of flash drives, silicon impurities can lead to certain cells being bad. Suppose the manufacturer is making 1G sticks of RAM. In order to ensure that 1G of usable memory is created, the manufacturer may produce 1.1G of memory. During testing, if one physical cell of RAM is found to be defective (e.g., physical cell 2), an entry is made in a file that maps logical portions of the RAM to physical ones, such that the defective physical portion will be skipped during use (i.e., by indicating that logical cell 2 maps to physical cell 3, with no logical cells mapping to physical cell 2). The location of the defective cells (e.g., obtained by accessing the file) can be used to identify a device.

Additional Detail

Ascertaining that the Device is in a Clean State

In some embodiments the verifier is configured to ascertain that the client is in a clean state (e.g., not actively running malicious code) in conjunction with the fingerprint generation/extraction processes. One reason for this is to prevent a malicious device from bypassing flash accesses and providing a forged or copied fingerprint. Software-based attestation techniques, secure boot techniques, and a collection of heuristic techniques used by anti-virus software are all examples of ways to provide such indications.

Example Use Cases

The device identification techniques described herein can be used in a variety of contexts, such as to suppress fraud, create audit trails, detect abuse, and maintain digital rights policies. The identity can also be used to bootstrap portions of a protocol. For example, if a software-based attestation tool relies on knowing the identity of a device being verified, the tool can work in conjunction with the techniques described herein to identify the device with certainty. Specific examples include:

(1) The owner of device 100 can be requested to enroll the device in order to use a banking application.

(2) Device 100's identity can be included in a list of approved identities allowed to access a subscription service.

(3) Device 100 is used to access a server that requires all accesses to its resources to be logged. The device identity as described herein can be included in the log data.

Transparent Enrollment

In some embodiments, enrollment with verifier 150 occurs transparently to a user of device 100, or with minimum input from the user (e.g., the only prompting is for the user to agree to the fingerprinting). As one example, each time a user of device 100 (hereinafter Alice) accesses a resource (such as her bank account), fingerprint information is collected (i.e., via verifier 150 acting in cooperation with Alice's banking application). If the same fingerprint is repeatedly observed by the verifier over a certain period of time (e.g., one month), without any fraudulent transactions occurring during that time, an assumption can be made that the device belongs to Alice.

Partial Fingerprint Data

In some embodiments, only a portion of the fingerprint is collected and/or transmitted to verifier 150. One reason for this would be to provide privacy protections to the user of device 100. If all of the defects of storage 130 are known, the device may be universally uniquely identified. Providing a subset of the fingerprint information still allows device 100 to be associated with Alice in a way that provides assurances that Alice is not being impersonated by a nefarious individual, just with lower assurances than would be provided by a more complete fingerprint.

Encrypted Fingerprint Data

In some embodiments, device 100 encrypts, hashes, or otherwise transforms the fingerprint or portions thereof.

Instead of providing the raw fingerprint to verifier 150, the transformed data is provided. This approach can be used, for example, to allow device 100 to be identified as belonging to a group without disclosing its exact identity. The fingerprint data can also be used for other cryptographic purposes, such as a message authentication code.

Error Free Blocks

In some embodiments, rather than determining which portions of storage 130 have errors, device 100 is identified based on which blocks do not have errors. For example, the location of the first error on the device's Bad Blocks List (block 1501) is used as an identifier of the device.

Removing/Upgrading Storage

In some cases, such as where storage 130 is a removable flash drive, a user of device 100 may wish to upgrade/replace storage 130. When the user inserts replacement flash, the user can be automatically prompted to re-enroll (e.g., by repeating process 200). If the user does not re-enroll, or if no prompting occurs, the next time the user attempts to use a service for which verification is required, a determination will be made that the user is not using an expected device. At that point, additional verification of the user can be performed (e.g., by having an agent contact the user via phone, sending the user an email, etc.) and if successful, a new fingerprint can be associated with the user and stored in verifier 150's database.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A device, comprising:
a storage device including blocks of storage cells; and
a processor coupled to the storage device, the processor configured to:
select a first bad block of the storage device, from a bad blocks list identifying blocks that should not be used in the storage device, wherein the first bad block already has storage cells with faults;
perform repeated write and erase operations to storage cells in the first bad block to generate an intentionally induced permanent fault;
designate the first bad block as a non-usable data area; and
generate a device identifier based on a fault location map that includes storage cell locations of faults, including the intentionally induced permanent fault, in the first bad block.

2. The device of claim 1, wherein the processor is further configured to determine whether an excessive number of permanent faults is present in the first bad block, and when an excessive number of faults is present, generate the device identifier based on generated intentionally induced permanent faults present in an alternate area of the storage device.

3. The device of claim 1, wherein the processor is further configured to erase the device identifier at least in part by repeatedly performing write and erase operations to generate additional intentionally induced permanent faults in the first bad block.

4. The device of claim 1, wherein the device identifier comprises a list of storage cell locations in the first bad block that do not include intentionally induced permanent faults generated in the storage cells in the first bad block.

5. The device of claim 1, wherein the processor is further configured to perform a software-based attestation prior to generating the device identifier.

6. The device of claim 1, wherein the processor is further configured to generate the device identifier in response to a request from a remote verifier.

7. A device, comprising;
a processor configured to:
receive a device identifier generated by a remote device; and
determine identity information associated with the remote device at least in part by matching the received device identifier against one or more stored device identifiers,
wherein the received device identifier is based on a fault location map that includes storage cell locations of faults, including a generated intentionally induced permanent fault in a selected first bad block of the remote device, where the first bad block was selected from a bad blocks list, identifying blocks that should not be used in the remote device, where repeated write and erase operations to storage cells in the selected first bad block were performed to generate the intentionally induced permanent fault; and
a memory coupled to the processor and configured to provide the processor with instructions.

8. The device of claim 7 wherein the processor is further configured to match the received device identifier at least in part by applying a threshold.

9. The device of claim 8 wherein the threshold allows for an increasing number of permanent faults.

10. The device of claim 7 wherein the processor is further configured to grant access to a resource based on a result of the determination.

11. The device of claim 7 wherein the matching is based on at least one of a presence and an absence of a fault in a specific storage cell location.

12. The device of claim 7, wherein the identity information indicates a group of potential devices of which the device is a member.

13. The device of claim 1, wherein the processor is further configured to select the first bad block from the bad blocks list based on a random selection.

14. The device of claim 1, wherein the processor is further configured to select the first bad block from the bad blocks list based on a pre-determined rule.

15. A method of managing an identity of a device, comprising:
selecting, from a storage device including blocks of storage cells, a first bad block of the storage device, from a bad blocks list identifying blocks that should not be used in the storage device, wherein the first bad block already has storage cells with faults;
performing repeated write and erase operations to storage cells in the first bad block to generate an intentionally induced permanent fault;
designating the first bad block as a non-usable data area; and
generating a device identifier based on a fault location map that includes storage cell locations of faults, including the intentionally induced permanent fault in the first bad block.

16. The method of claim 15, further comprising determining whether an excessive number of permanent faults is present in the first bad block, and when an excessive number of permanent faults is present, generating the device identifier based on generated intentionally induced permanent faults present in an alternate area of the storage device.

17. The method of claim 15, further comprising erasing the device identifier at least in part by repeatedly performing write and erase operations to generate additional intentionally induced permanent faults in the first bad block.

18. The method of claim 15, wherein the device identifier comprises a list of storage cell locations in the first bad block that do not include intentionally induced permanent faults generated in the storage cells in the first bad block.

19. The method of claim 15, further comprising performing a software-based attestation prior to generating the device identifier.

20. The method of claim 15, further comprising generating the device identifier in response to a request from a remote verifier.

21. The device of claim 1, wherein the processor is further configured to:
   determine if a second bad block, different from the first bad block, is required to be selected, and if the second bad block is required:
      select the second bad block from the bad blocks list, wherein the second bad block already has storage cells with faults;
      perform repeated write and erase operations to storage cells in the second bad block to generate a second intentionally induced permanent fault; and
      generate the device identifier based on a second fault location map that includes storage cell locations of faults, including the intentionally induced permanent fault in the first bad block and the second intentionally induced permanent fault in the second bad block.

22. The device of claim 1, wherein the intentionally induced permanent fault is distinct from a fault that occurs during manufacture or normal use subsequent to manufacture.

23. The device of claim 1, wherein the processor is further configured to identify the intentionally induced permanent fault, which cannot be removed, and which is distinct from temporary faults that can be removed.

24. The device of claim 1, wherein the intentionally induced permanent fault is added and cannot disappear.

25. The device of claim 1, wherein the processor is configured to generate the intentionally induced permanent fault in response to a first use of the device by an end user, or in response to an end user taking a pre-defined action.

26. The device of claim 7, wherein the processor is further configured to:
   correctly identify the remote device when the device identifier generated by the remote device is different from the one or more stored device identifiers due to an addition of temporary errors to the fault location map that includes storage cell locations of faults, including the generated intentionally induced permanent fault in the selected first bad block of the remote device.

27. The method of claim 15, wherein the intentionally induced permanent fault, which cannot be removed, is distinct from temporary faults that can be removed.

28. The method of claim 15, wherein the intentionally induced permanent fault is added and cannot disappear.

29. The method of claim 15, further comprising, generating the intentionally induced permanent fault in response to a first use of the device by an end user, or in response to an end user taking a pre-defined action.

* * * * *